(12) United States Patent
Kim et al.

(10) Patent No.: US 7,205,799 B2
(45) Date of Patent: Apr. 17, 2007

(54) INPUT BUFFER HAVING A STABILIZED OPERATING POINT AND AN ASSOCIATED METHOD

(75) Inventors: Hyun-Jin Kim, Gyeonggi-do (KR); Seong-Jin Jang, Gyeonggi-do (KR); Kwang-Il Park, Gyeonggi-do (KR); Sang-Joon Hwang, Seoul (KR); Ho-Young Song, Gyeonggi-do (KR); Ho-Kyong Lee, Gyeonggi-do (KR); Woo-Jin Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 31 days.

(21) Appl. No.: 11/225,915

(22) Filed: Sep. 13, 2005

(65) Prior Publication Data
US 2006/0066364 A1 Mar. 30, 2006

(30) Foreign Application Priority Data
Sep. 20, 2004 (KR) ...................... 10-2004-0074957

(51) Int. Cl.
*H03K 3/00* (2006.01)
(52) U.S. Cl. ...................... 327/108; 327/112
(58) Field of Classification Search ......... 327/108–112
See application file for complete search history.

(56) References Cited

U.S. PATENT DOCUMENTS 5,606,275 A * 2/1997 Farhang et al. ............. 327/108

FOREIGN PATENT DOCUMENTS

KR 2000-0002026 1/2000
KR 2002-0088109 11/2002

OTHER PUBLICATIONS

English language abstract of Korean Publication No. 2000-0002026.
English language abstract of Korean Publication No. 2002-0088109.

* cited by examiner

*Primary Examiner*—Kenneth B. Wells
(74) *Attorney, Agent, or Firm*—Marger Johnson & McCollom, P.C.

(57) ABSTRACT

We describe an input buffer having a stabilized operating point and an associated method. An input buffer may include a first differential amplifying unit to generate a first output signal having a first operating point and a second differential amplifying unit to generate a second output signal having a second operating point. An output control circuit varies respective weights of the first and second output signals responsive to an output control signal. The first differential amplifying unit may operate responsive to a reference voltage and an input voltage signal. The second differential amplifying unit may operate responsive to the reference voltage and the input voltage signal. The first operating point may be relatively higher than the second operating point.

20 Claims, 5 Drawing Sheets

INPUT BUFFER HAVING A STABILIZED OPERATING POINT AND AN ASSOCIATED METHOD

PRIORITY CLAIM

This application claims priority under 35 U.S.C. § 119 to Korean Patent Application No. 2004-74957, filed on Sep. 20, 2004, the contents of which we incorporate by reference.

BACKGROUND

1. Field

The present invention relates to an input buffer of a receiver and, more particularly to an input buffer capable of calibrating an output characteristic in reference voltage variations and an associated method.

2. Related Art

In data transmission, a predetermined reference voltage is used to determine whether a received digital data signal has a logic high state or logic low state. A voltage level of the data signal is compared with a reference voltage externally or internally provided by a receiver's input buffer. The comparison result is transmitted to internal logic of the receiver. The input buffer may have various types. The input buffer for use in a synchronous semiconductor memory device may include a differential amplifier having a current mirror.

FIG. 1 is a circuit diagram of an input buffer 100. Referring to FIG. 1, when an enable signal EN disables the input buffer 100 with a high logic high level (i.e., an inactive state), a transistor MP13 is turned off so that an output signal Vout has a logic low level regardless of a voltage level of an input signal Vin. Conversely, when the enable signal EN enables the input buffer 100 with a logic low level (i.e., an active state), the transistor MP13 is turned on so that current flows through current paths 101 and 102 of the differential amplifier.

When the input signal Vin has a voltage level higher than the reference voltage Vref, an impedance of an NMOS transistor MN12 receiving the input signal Vin is lower than an impedance of an NMOS transistor MN11 receiving the reference voltage Vref so that the output signal Vout has a logic low level. Conversely, when the input signal Vin has a voltage level lower than the reference voltage Vref, the impedance of the NMOS transistor MN12 is higher than the impedance of the NMOS transistor MN11 so that the output signal Vout has a logic high level.

An inverter (not shown) may be disposed at an output terminal so that the output signal Vout may be inverted and transmitted to the internal logic as a final output signal. Therefore, the final output signal may have a logic high level when the input signal Vin has a voltage level higher than the reference voltage Vref and the output signal may have a logic low level when the input signal Vin has a voltage level lower than the reference voltage Vref.

The stability of the reference voltage Vref greatly affects data transmission accuracy. Because a setup time (tDS) and a hold time (tDH) of the input signal Vin may become shorter as the data rate increases, comparison of input signal Vin with the reference voltage Vref may occur at a time different than calculated in the chip's design process, particularly when the reference voltage Vref changes.

Thus, the reference voltage Vref, which needs to be kept stable to verify the reliability of the data transmission, may fluctuate for various reasons. First, signal interference may be caused by parasitic capacitance of a MOS transistor of input buffer that receives the reference voltage Vref, affecting its voltage level. And the reference voltage Vref may be affected by noise on the power supply voltage, manufacturing process, temperature variations, and the like.

When the reference voltage Vref becomes unstable, an operating point of the input buffer becomes unstable affecting a duty of the output signal. More particularly, as a data rate of the semiconductor device increases up to about several gigabits per second (Gbps), capacitance in each transistor increasingly influences the output characteristics of the input buffer. This may cause a problem. The input buffer may not provide an accurate signal to the internal logic, causing errors.

A calibration operation may reduce variations between input and output terminals (DQ) of the semiconductor device and the input buffer to meet the setup time (tDS) and the hold time (tDH) of an AC timing for high-speed data transmission.

FIG. 2 is a circuit diagram of a reference voltage calibrating circuit 200. Referring to FIG. 2, the reference voltage calibrating circuit 200 includes an operational amplifier 211 and capacitors 221, 222, 223, and 224 that are serially coupled to the operational amplifier 211.

The operational amplifier 211 may be configured as a buffer 210 to buffer the reference voltage Vref. The reference voltage Vref may be externally provided or alternatively, generated using an internal reference voltage generating source. Using the serially coupled capacitors 221, 222, 223 and 224, the buffered reference voltage Vref is divided to generate a plurality of reference voltages Vref1, Vref2 and Vref3. The capacitors 221, 222, 223 and 224 may be replaced with resistors or other known circuit components. An advantage of using capacitors 221, 222, 223 and 224 is reduced chip area relative to other circuit components.

The reference voltages Vref1, Vref2 and Vref3 may be selected according to a control signal and provided to the input buffer.

Although the reference voltage calibrating circuit may be implemented in a variety of configurations according to design constraints, one or two reference voltage calibrating circuits may be allotted to eight input and output terminals (DQ) to provide the reference voltage to each input and output terminal (DQ).

The reference voltage calibrating circuit requires as many capacitors as the required number of selectable reference voltage levels. The chip's layout area, therefore, increases accordingly. And noise generated in the operational amplifier 211 may adversely influence the input buffer.

The voltage calibrating circuit increases power consumption due to the use of the operational amplifier 211 and the capacitors 221, 222, 223 and 224.

SUMMARY

We describe an input buffer having a stabilized operating point and an associated method that substantially addresses one or more disadvantages of the related art.

Example embodiments may provide an input buffer capable of calibrating an output characteristic according to reference voltage variations.

Example embodiments may provide a method of calibrating an output characteristic according to reference voltage variations.

We describe an input buffer having a stabilized operating point and an associated method. An input buffer may include a first differential amplifying unit to generate a first output signal having a first operating point and a second differential amplifying unit to generate a second output signal having a second operating point. An output control circuit varies respective weights of the first and second output signals responsive to an output control signal. The first differential amplifying unit may operate responsive to a reference voltage and an input voltage signal.

The second differential amplifying unit may operate responsive to the reference voltage and the input voltage signal.

The first operating point may be relatively higher than the second operating point.

The first and second differential amplifying units may respectively include input size-mismatched transistors.

The output control circuit may include a digital-to-analog converter.

We describe a semiconductor memory device including at least one input node to receive an input voltage signal and at least one reference node to receive a reference voltage. At least one second input node receives an output control signal. A first differential amplifying unit may generate a first output signal having a first operating point responsive to the reference voltage and the input voltage signal. A second differential amplifying unit may generate a second output signal having a second operating point responsive to the reference voltage and the input voltage signal. An output control circuit to generate first and second control voltages that weigh the first and second output signals responsive to the output control signal. And an output coupling circuit may combine the weighted first and second output signals.

The first operating point may be relatively higher than the second operating point.

The first differential amplifying unit may include a first input transistor to receive the reference voltage and a second input transistor to receive the input voltage signal, the first input transistor having a first size larger than a second size of the second input transistor.

The second differential amplifying unit may include a third input transistor to receive the reference voltage and a fourth input transistor to receive the input voltage signal, the third input transistor having a third size smaller than a fourth size of the fourth input transistor.

The output control signal is a digital signal may have a predetermined number of bits each having a bit value and an inverted bit value.

The output control signal is generated by a mode register command.

We describe a method including generating a first output signal having a first operating point responsive to a reference voltage and an input voltage signal and generating a second output signal having a second operating point responsive to the reference voltage and the input voltage signal. The method further includes applying a corresponding weight to the first and second output signals responsive to an output control signal and generating a third output signal by combining the first and second output signals after the applying the corresponding weight.

The method may further include setting the first operating point relatively higher than the second operating point.

BRIEF DRAWINGS DESCRIPTION

The present will become more apparent to those of ordinary skill in the art by describing, in detail, example embodiments with reference to the attached drawings, where like elements are represented by like reference numerals, which are given by way of illustration only.

DETAILED DESCRIPTION

The following description references the accompanying drawings.

It will be understood that although the terms first, second, and the like, may be used here to describe various elements, these elements should not be limited by these terms. These terms are only used to distinguish one element from another. For example, a first element could be termed a second element, and, similarly, a second element could be termed a first element, without departing from the present scope. As used here, the term and/or includes any and all combinations of one or more of the associated listed items.

It will be understood that when an element is referred to as being connected or coupled to another element, it can be directly connected or coupled to the other element or intervening elements may be present. In contrast, when an element is referred to as being directly connected or directly coupled to another element, there are no intervening elements present. Other words used to describe the relationship between elements should be interpreted in a like fashion (e.g., between versus directly between, adjacent versus directly adjacent, and the like).

The terminology used here is for the purpose of describing particular embodiments only and is not intended to be limiting. As used here, the singular forms a, an, and the, are intended to include the plural forms as well, unless the context clearly indicates otherwise. It will be further understood that the terms comprises, comprising, includes and/or including, when used here, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used here have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined here.

Figure 2:
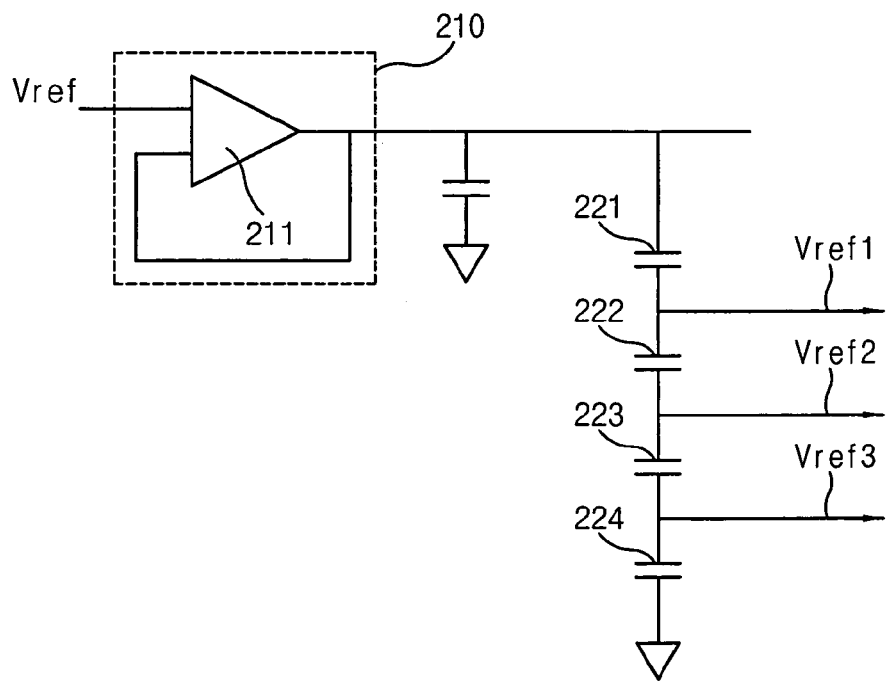
FIG. 2 is a circuit diagram illustrating a reference voltage calibrating circuit.
Figure 3:
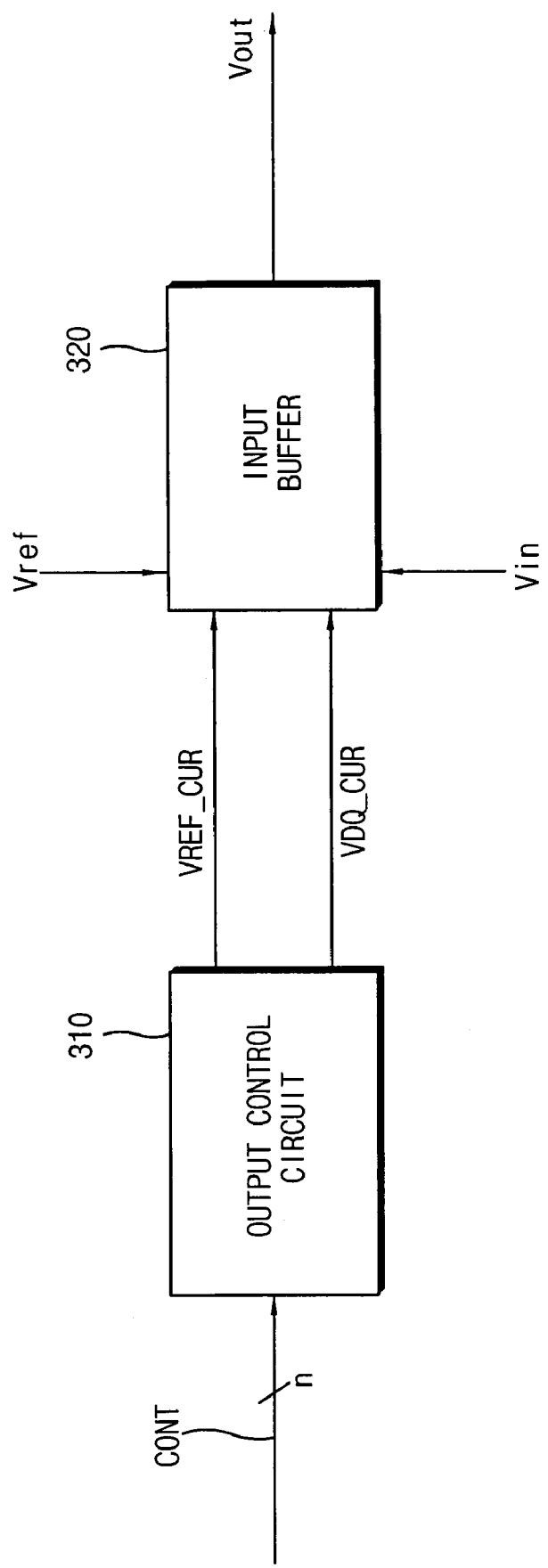
FIG. 3 is a block diagram illustrating an input buffer embodiment including reference voltage calibration.

FIG. 3 is a block diagram illustrating an input buffer 320 including reference voltage calibration. Referring to FIG. 3, output control circuit 310 calibrates the output characteristics of the input buffer 320. Similar to the reference voltage calibrating circuit 200 in FIG. 2, the output control circuit 310 may control a plurality of the input buffers. For example, one output control circuit 310 may control the output characteristics of four or eight input buffers.

The output control circuit 310 receives an output control signal CONT. The output control signal CONT may correspond to a digital control signal having a predetermined number of bits n.

The digital control signal CONT may be generated based on a mode register command of a semiconductor device, or alternatively, the digital control signal CONT may be externally provided through a separate pad. When two or more output control circuits 310 are included in the semiconductor device and the digital control signal CONT is externally provided through the separate pad, the output characteristics of each input buffer 320 may be independently adjusted by the two or more output control circuits 310 in combination with the mode register command.

A number of the bits of the digital control signal CONT may be determined according to a resolution of the required correction capability of the output control circuit. As will be described later, the output control circuit 310 here is used to adjust the operating point of the output buffer 320 so that the bit number of the digital control signal CONT may be determined according to a resolution along the operating point of the output buffer. In an embodiment, the digital control signal CONT may have four bits to adjust the operating point of the input buffer by a resolution of $2^4$ (i.e., 16).

The output control circuit 310 provides two complementary output control voltages VREF_CUR and VDQ_CUR responsive to the output control signal CONT to the input buffer 320.

In an embodiment, the output control circuit 310 may include a digital-to-analog converter DAC that controls the input buffer 320 responsive to the output control signal CONT.

In an embodiment, the input buffer 320 may include two parallel comparators (not shown), where each comparator forms a differential amplifier. According to an example embodiment of the present invention, input transistors that respectively receive the reference voltage and the input signal are purposely size-mismatched relative to each other so that one differential amplifier has a relatively high operating point and the other differential amplifier has a relatively low operating point. The output control voltages VREF_CUR and VDQ_CUR may function as respective weights for outputs of the two differential amplifiers included in the input buffer 320. The input buffer 320 generates an output signal Vout responsive to the outputs of the two differential amplifiers that are weighted by the output control voltages VREF_CUR and VDQ_CUR.

By adjusting the digital output control signal CONT, the operating point and duty cycle of the output signal Vout may be properly calibrated according to a change in the reference voltage and a delay time.

Figure 4:
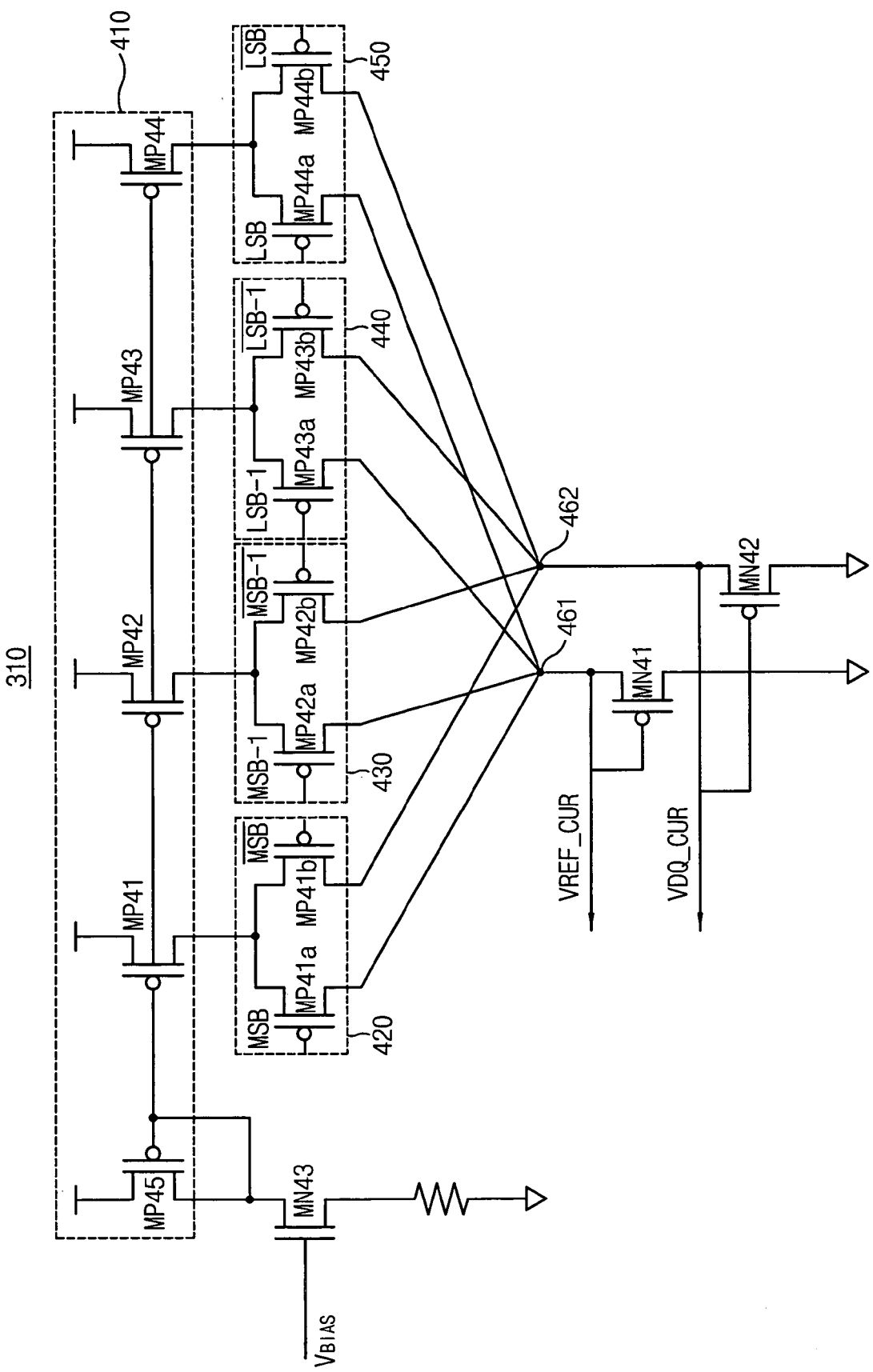
FIG. 4 is a circuit diagram illustrating an embodiment of the output control circuit shown in FIG. 3.

FIG. 4 is a circuit diagram illustrating an embodiment of the output control circuit 310 implemented as a digital-to-analog converter.

The digital-to-analog converter 310 outputs the output control signal CONT to the transistors 420, 430, 440 and 450. The digital-to-analog converter 310 outputs a first output control voltage VREF_CUR and a second output control voltage VDQ_CUR. In one example embodiment, the output control signal CONT may be a 4-bit digital signal.

The digital-to-analog converter 310 includes an NMOS transistor MN43 with a gate electrode that receives a DC bias voltage VBIAS. A current mirror 410 includes PMOS transistors MP41, MP42, MP43, MP44 and MP45. Each PMOS transistor generates a current mirrored from a current through the NMOS transistor MN43.

The PMOS transistors MP41, MP42, MP43, MP44 and MP45 have sizes (e.g., transistor width-to-length ratio) different from one another to output corresponding $2^4$ (i.e., 16) analog output signals based on the 4-bit output control signal CONT. For example, the PMOS transistor MP43 may have a size twice that of the PMOS transistor MP44 and the PMOS transistor MP42 may have a size twice that of the PMOS transistor MP43. Additionally, the PMOS transistor MP41 may have a size twice that of the PMOS transistor MP42.

The PMOS transistors MP41, MP42, MP43 and MP44 have drain electrodes respectively coupled to first through fourth pairs of parallel-coupled transistors 420, 430, 440 and 450. Each of the transistors 420, 430, 440 and 450 include pairs of parallel-coupled transistors.

The first pair of transistors 420 includes two PMOS transistors MP41a and MP41b that respectively receive a most significant bit (MSB) and an inverted most significant bit (/MSB) of the 4-bit digital output control signal CONT.

The second pair of transistors 430 includes two PMOS transistors MP42a and MP42b that respectively receive a second most significant bit (MSB-1) and an inverted second most significant bit (/MSB-1) of the 4-bit digital output control signal CONT.

The third pair of transistors 440 includes two PMOS transistors MP43a and MP43b that respectively receive a second least significant bit (LSB-1) and an inverted second least significant bit (/LSB-1) of the 4-bit digital output control signal CONT.

The fourth pair of transistors 450 includes two PMOS transistors MP44a and MP44b that respectively receive a least significant bit (LSB) and an inverted least significant bit (/LSB) of the 4-bit digital output control signal CONT.

The currents generated by the current mirror 410 are switched by the transistor pairs 420, 430, 440 and 450, and the switched currents are converged at current coupling nodes 461 and 462, respectively.

The currents at the current coupling nodes 461 and 462 are converted to a voltage by load elements MN41 and MN42. Load elements MN41 and MN42 are serially coupled between the current coupling nodes 461 and 462 and a ground (or low supply voltage), respectively.

In an embodiment, the current at the current coupling node 461 is converted to the first output control voltage VREF_CUR by the load element MN41 and the current at the current coupling node 462 is converted to the second output control voltage VDQ_CUR by the load element MN42.

The load elements MN41 and MN42 may include a diode-connected transistor as is shown in FIG. 4. The load element may alternatively have any other type of elements, suitable for loading the currents at nodes 461 and 462, e.g., a resistor.

The first and second output control voltages VREF_CUR and VDQ_CUR may vary in complement with each other. In an embodiment, when the first output control voltage VREF_CUR increases, the second output control voltage VDQ_CUR decreases. Conversely, when the first output control voltage VREF_CUR decreases, the second output control voltage VDQ_CUR increases.

The first and second output control voltages VREF_CUR and VDQ_CUR generated by the output control circuit 310 (e.g., implemented as the digital-to-analog converter) based on the output control signal CONT are provided to the input buffer 320 (FIG. 3).

Figure 5:
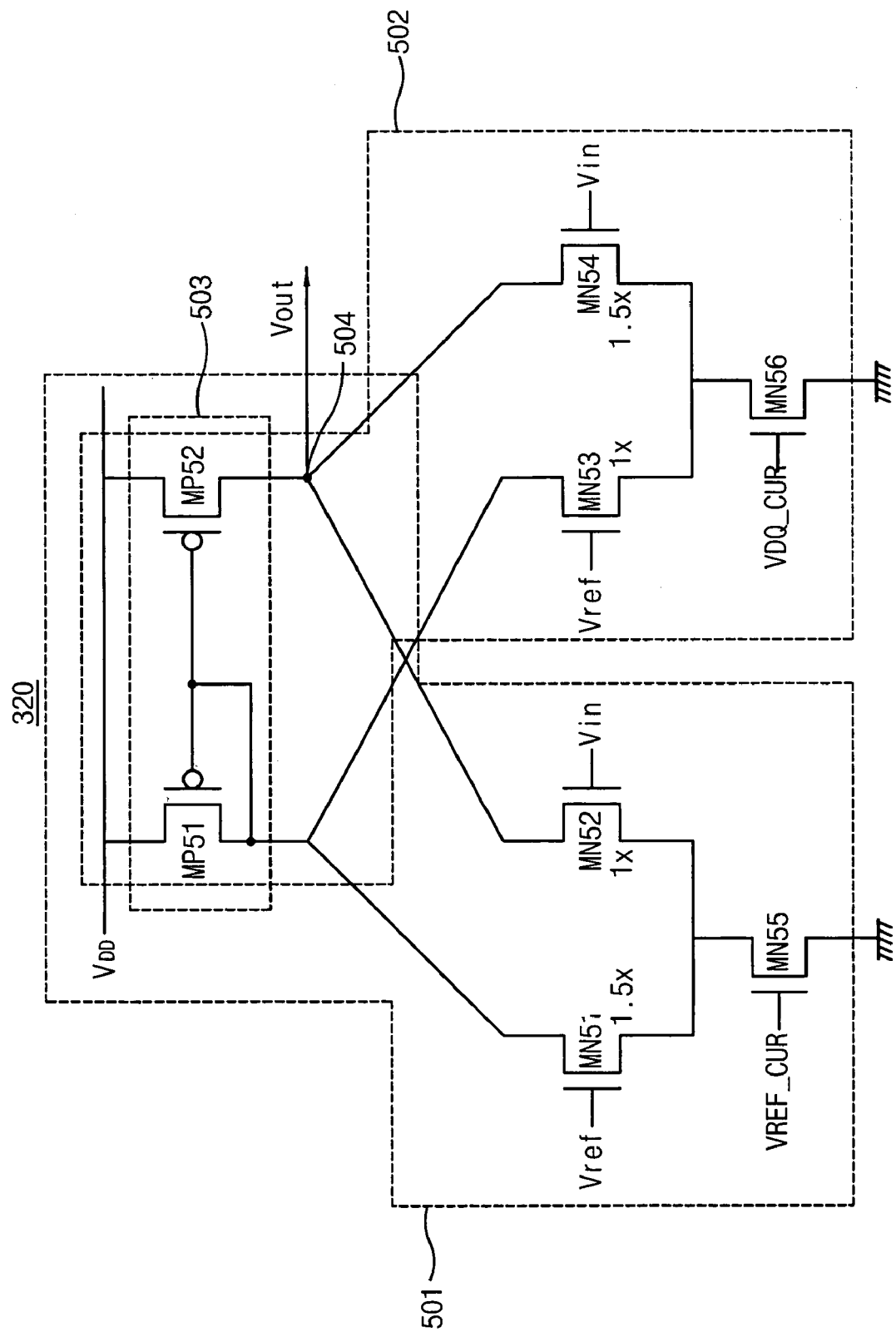
FIG. 5 is a circuit diagram illustrating an embodiment of the input buffer shown in FIG. 3.

FIG. 5 is a circuit diagram illustrating an embodiment of the input buffer 320. The input buffer 320 calibrates the output characteristic according to a variance in the reference voltage.

Referring to FIG. 5, the input buffer 320 includes two comparators 501 and 502. The comparators 501 and 502 form first and second differential amplifiers, respectively. The first and second differential amplifiers 501 and 502 include a common load element 503.

The load element 503 may correspond to an active load that forms a current mirror. In one embodiment, the load element 503 may include transistors MP51 and MP52 having substantially the same size and forming a current mirror.

The first differential amplifier 501 includes a first input transistor MN51 having a gate electrode controlled by the reference voltage Vref. A second input transistor MN52 includes a gate electrode controlled by the input signal Vin.

A sum of currents flow through the first input transistor MN51. The second input transistor MN52 is controlled by a bias current source MN55 based on the first output control voltage VREF_CUR.

In an embodiment, the bias current source MN55 may include an NMOS transistor or any other suitable device.

In an embodiment, the first input transistor MN51 and the second input transistor MN52 of the first differential amplifier 501 are purposely size-mismatched to each other.

Namely, in one example embodiment, the first input transistor MN51 has a size 1.5 times larger than a size of the second input transistor MN52. The numeral 1.5 that is indicative of a size multiplication ratio between the first and second input transistors MN51 and MN52. The numeral is given only for the purpose of the illustrative example. Any appropriate value less than 1.5 or greater than 1.5 may be selected as the size multiplication ratio according to the resolution of the required correction capability. When the size multiplication ratio is less than 1.5, the calibration of the output characteristics of the input buffer may be more precisely carried out. When the size multiplication ratio is greater than 1.5, the output characteristics calibration may be performed over a wide voltage level despite a decrease in precision of the calibration of the output characteristics.

Figure 1:
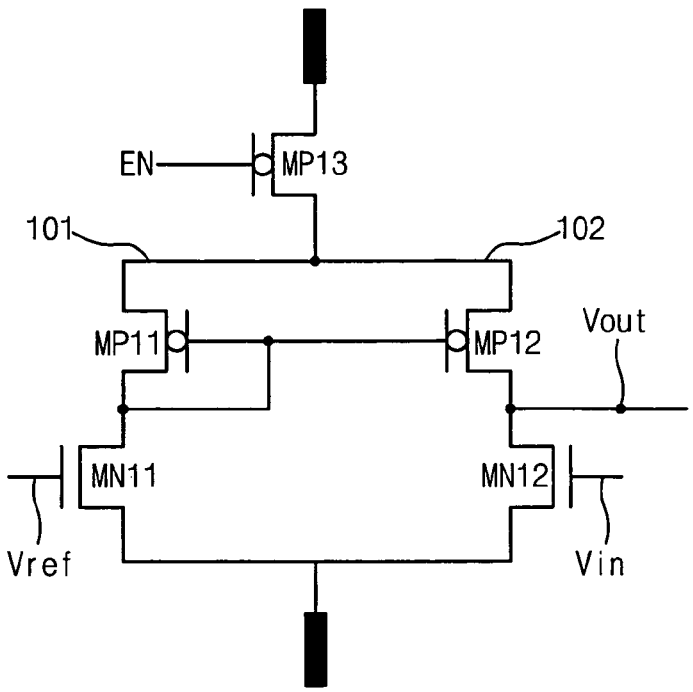
FIG. 1 is a circuit diagram illustrating an input buffer.

By using such a size mismatched structure, the first differential amplifier 501 may have a relatively higher operating point than is possible with known designs, e.g., the input buffer 100 shown in FIG. 1 that includes size-matched input transistors.

In an embodiment where the first input transistor MN51 and the second transistor MN52 receive substantially the same voltage level at the respective gate electrodes (i.e., the reference voltage Vref and the input signal Vin applied to the first and second input transistors MN51 and MN52 have substantially the same voltage level), a current flowing through the first input transistor MN51 is relatively larger compared with the second input transistor MN52. An output signal of the first differential amplifier 501, therefore, has a voltage level relatively higher than an output signal of the differential amplifier in FIG. 1 where the input transistors have size-matched or balanced sizes.

Even when the reference voltage Vref applied to the first input transistor MN51 is lower than a preset reference voltage, the operating point of the output signal does not change.

The second differential amplifier 502 includes a third input transistor MN53 having a gate electrode controlled by the reference voltage Vref. A fourth input transistor MN54 has a gate electrode controlled by the input signal Vin.

A sum of currents flowing through the third and fourth input transistors MN53 and MN54 is controlled by a bias current source MN56 based on the second output control voltage VDQ_CUR.

In an embodiment, the bias current source MN56 may include an NMOS transistor or any other suitable device.

Similar to the first differential amplifier 501, the third input transistor MN53 and the fourth input transistor MN54 are purposely size-mismatched.

Namely, in an embodiment, the fourth input transistor MN54 has a size 1.5 times larger than a size of the third input transistor MN53. The numeral 1.5 is indicative of a size multiplication ratio between the third and fourth input transistors MN53 and MN54. It is given only for the purpose of the example, as already described with respect to the first differential amplifier 501.

When the sizes of the third and fourth input transistors MN53 and MN54 are mismatched, the second differential amplifier 502 may have a relatively lower operating point than known devices, e.g., the input buffer 100 shown in FIG. 1.

In an embodiment where the third input transistor MN53 and the fourth transistor MN54 receive substantially the same voltage level at the respective gate electrodes there (i.e., the reference voltage Vref and the input signal Vin have substantially the same voltage level), a current flowing through the third input transistor MN53 is relatively smaller compared with the fourth input transistor MN54. An output signal of the second differential amplifier 502 has a voltage level relatively lower than the output signal of the differential amplifier shown in FIG. 1 where the input transistors have size-matched or balanced sizes.

Even when the reference voltage Vref applied to the third input transistor MN53 is higher than a preset reference voltage, the operating point of the output signal does not change.

The bias current source MN55 and the bias current source MN56 receive the first and second output control voltages VREF_CUR and VDQ_CUR, respectively, to generate respective associated currents.

As described above, the first and second output control voltages VREF_CUR and VDQ_CUR vary in complement with each other so that a sum of respective currents flowing through the bias current source MN55 and the bias current source MN56 remains substantially constant. Thus, a gain characteristic of the input buffer 320 is not affected.

An output current of the first differential amplifier 501 is controlled by the first output control voltage VREF_CUR. And an output current of the second differential amplifier 502 is controlled by the second output control voltage VDQ_CUR.

The output current of the first differential amplifier 501 and the output current of the second differential amplifier 502 are summed to generate a final output signal Vout at a node 504. The final output signal Vout may be processed in predetermined steps and transmitted to internal logic. In general, an amplifying stage, an inverter, and other appropriate stages may be additionally used to process the final output signal.

The output control signal CONT may be controlled, for example, using a mode register command according to a variance in the reference voltage Vref (e.g., externally provided). The input buffer, for example, may be adjusted to have appropriate output characteristics.

For example, when the reference voltage Vref has a voltage level lower than a preset reference voltage, the output control signal CONT may be adjusted such that the first differential amplifier 501 has a larger amount of currents therethrough. Conversely, when the reference voltage Vref has a voltage level higher than the preset reference voltage, the output control signal CONT may be adjusted such that the second differential amplifier 501 has a larger current.

Figure 6:
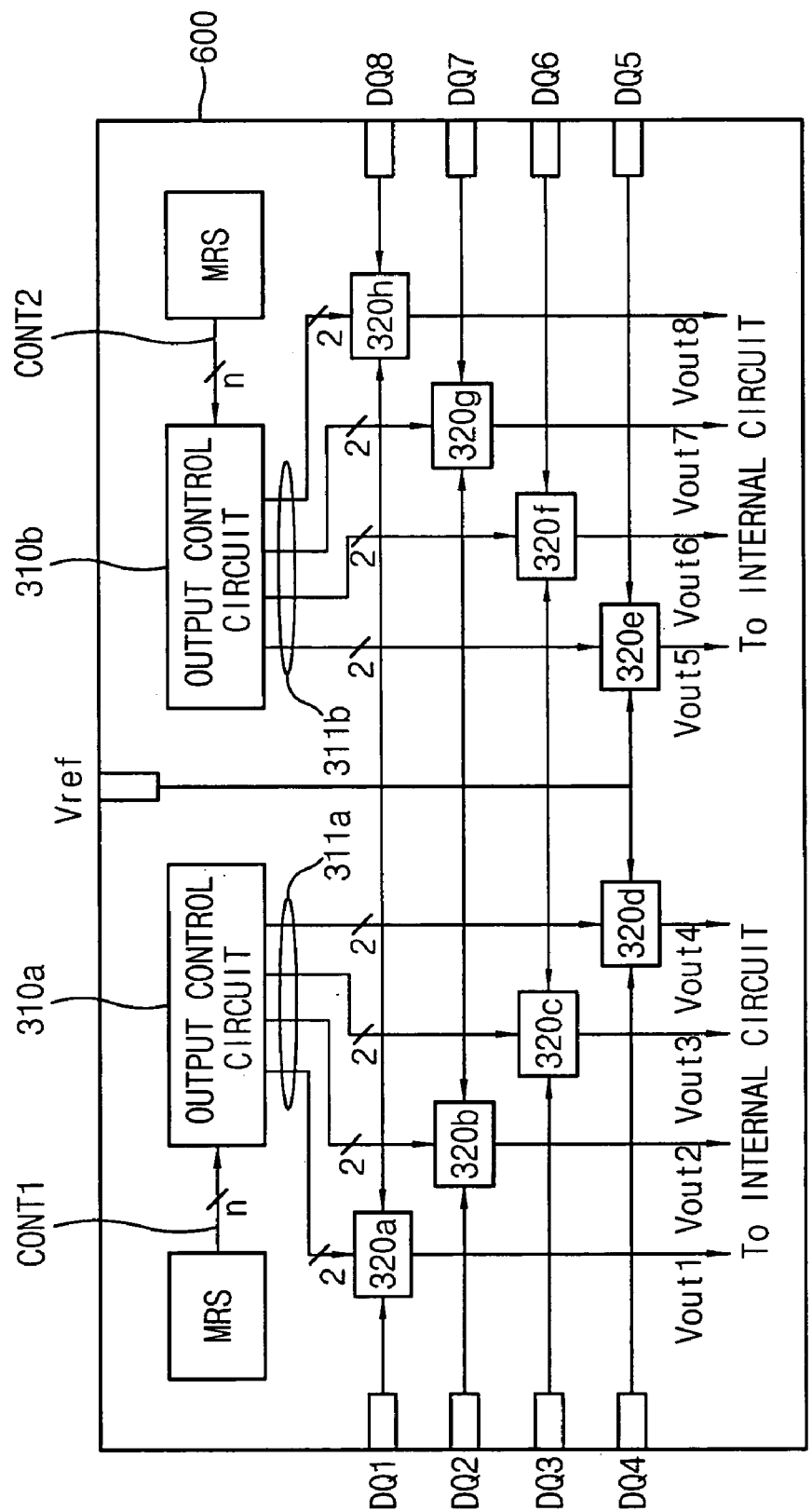
FIG. 6 is a block diagram illustrating an embodiment of a semiconductor device having an input buffer for calibrating an output characteristic according to reference voltage variations.

FIG. 6 is a block diagram illustrating an embodiment of a semiconductor device 600 having an input buffer for calibrating output characteristics according to reference voltage variations.

The semiconductor device 600 includes a plurality of input signal pads DQ1 through DQ8 to receive a plurality of input signals.

The semiconductor device 600 includes input buffers 320a, 320b, 320c, 320d, 320e, 320f, 320g and 320h that receive the input signals through the input signal pads DQ1 through DQ8 and the reference voltage Vref to provide a plurality of output signals Vout1 to Vout8 to the internal logic.

Each of the input buffers 320a to 320h has size-mismatched input transistors to calibrate the output characteristics according to reference voltage variations. In an embodiment, one input buffer may be allotted for every input pad (i.e., each input signal).

The semiconductor device 600 receives eight input signals through eight input pads DQ1 through DQ8 and one externally provided reference voltage Vref. In FIG. 6, two output control circuits 310a and 310b each control four input buffers. Namely, the output control circuit 310a controls four input buffers 320a through 320d that respectively receive the input signals through four input pads DQ1 through DQ4. Likewise, the output control circuit 310b controls four input buffers 320e through 320h that respectively receive the input signals through four input pads DQ5 through DQ8.

It is noted that the number of input signals, and the method of receiving the input signal and the reference voltage may vary according to each semiconductor device's configuration. Similarly, a number of the input buffers that are controlled by one output control circuit may vary according to various embodiments.

The output control circuit 310a outputs output control voltages 311a to the input buffers 320a to 320d based on the output control signal CONT1. The output control voltages 311a control currents in respective differential amplifiers of the input buffers 320a to 320d having size-mismatched input transistors, as already described with respect to FIGS. 4 and 5. Similarly, the output control circuit 310b outputs output control voltages 311b to the input buffers 320e to 320h based on the output control signal CONT2. The output control voltages 311b control currents in respective differential amplifiers of the input buffers 320e to 320h having size-mismatched input transistors, as already described with respect to FIGS. 4 and 5.

The output control signals CONT1 and CONT2 of the output control circuits 310a and 310b may be generated by a mode register command.

The following is an input buffering method of a semiconductor device, which may perform output characteristics calibration with respect to reference voltage variations.

First, the reference voltage and an input voltage signal are provided to the input buffer. The output control signal for controlling an output of the input buffer is provided to the input buffer.

In the input buffer, a first output signal having a first operating point is generated based on a difference between the reference voltage and the input voltage signal. And a second output signal having a second operating point is generated based on a difference between the reference voltage and the input voltage signal.

Based on the output control signal, a set of weights for each of the first output signal and the second output signal are controllably varied. A weighted first output signal and a weighted second output signal are combined to generate a final output signal.

In an embodiment, when the reference voltage becomes unstable due to noise on the power supply voltage or process variations present in each chip, temperature variations, and the like, the delay time and duty of the input buffer may be properly calibrated so as not to interfere with the operating point of the input buffer. The input buffer, therefore, may have appropriate corresponding characteristics adapted for each data timing standard of the input signal to transmit an accurate signal to the internal circuit. Accordingly, a high-speed operation of the semiconductor device is improved.

Having thus described example embodiments of the present invention, it is to be understood that the invention defined by the appended claims is not to be limited by particular details set forth in the above description as many apparent variations thereof are possible without departing from the spirit or scope thereof as hereafter claimed.

We claim:

1. An input buffer in a semiconductor device, comprising:
    a first differential amplifying unit to generate a first output signal having a first operating point;
    a second differential amplifying unit to generate a second output signal having a second operating point; and
    an output control circuit to vary respective weights of the first and second output signals responsive to an output control signal.

2. The input buffer of claim 1
    where the first differential amplifying unit is adapted to operate responsive to a reference voltage and an input voltage signal; and
    where the second differential amplifying unit is adapted to operate responsive to the reference voltage and the input voltage signal.

3. The input buffer of claim 1 where the first operating point is relatively higher than the second operating point.

4. The input buffer of claim 2
    where the first differential amplifying unit includes:
        a first input transistor to receive the reference voltage; and
        a second input transistor to receive the input voltage signal;
        where the first input transistor includes a size larger than that of the second input transistor; and
    where the second differential amplifying unit includes:
        a third input transistor to receive the reference voltage; and
        a fourth input transistor to receive the input voltage signal;
        where the third input transistor includes a size smaller than that of the fourth input transistor.

5. The input buffer of claim 1 where the output control circuit is adapted to generate a first control voltage for the first differential amplifying unit and a second control voltage for the second differential amplifying unit responsive to the output control signal.

6. The input buffer of claim 5 where the output control signal is a digital signal having a predetermined number of bits.

7. The input buffer of claim 6
    where the output control circuit includes a digital-to-analog converter; and where the first control voltage is adapted to vary in complement with the second control voltage responsive to the output control signal.

8. The input buffer of claim 7
where the digital-to-analog converter includes a plurality of pairs of transistors; and
where each pair of the transistors is adapted to be controlled by a bit value and an inverted bit value of the output control signal.

9. The input buffer of claim 5
where the output control circuit includes a plurality of transistor pairs, each transistor pair having an associated current flowing there through;
where the output control circuit is adapted to generate the first control voltage responsive to the transistor pairs adapted to operate responsive to a bit value of the output control circuit; and
where the output control circuit is adapted to generate the second control voltage responsive to the transistor pairs adapted to operate responsive to inverted bit values of the output control circuit.

10. The input buffer of claim 5
where the first differential amplifying unit includes a first bias current source adapted to control currents flowing in first input transistors responsive to the first control voltage; and
where the second differential amplifying unit includes a second bias current source adapted to control currents flowing in second input transistors responsive to a control of the second control voltage.

11. The input buffer of claim 1 comprising an output coupling circuit to combine the first and second output signals after being weighted by the output control circuit.

12. The input buffer of claim 11 where the output coupling circuit includes a load to generate a third output signal.

13. The input buffer of claim 12 where the load includes a current mirror.

14. A semiconductor memory device comprising:
at least one input node to receive an input voltage signal;
at least one reference node to receive a reference voltage;
at least one second input node to receive an output control signal;
a first differential amplifying unit to generate a first output signal having a first operating point responsive to the reference voltage and the input voltage signal;
a second differential amplifying unit to generate a second output signal having a second operating point responsive to the reference voltage and the input voltage signal;
an output control circuit to generate first and second control voltages that weigh the first and second output signals responsive to the output control signal; and
an output coupling circuit to combine the weighted first and second output signals.

15. The input buffer of claim 14 where the first operating point is relatively higher than the second operating point.

16. The input buffer of claim 15
where the first differential amplifying unit includes:
a first input transistor to receive the reference voltage; and
a second input transistor to receive the input voltage signal, the first input transistor having a first size larger than a second size of the second input transistor; and
where the second differential amplifying unit includes:
a third input transistor to receive the reference voltage; and
a fourth input transistor to receive the input voltage signal, the third input transistor having a third size smaller than a fourth size of the fourth input transistor.

17. The input buffer of claim 13 where the output control signal is a digital signal having a predetermined number of bits each having a bit value and an inverted bit value.

18. The input buffer of claim 17 where the output control signal is generated by a mode register command.

19. A method of buffering data, comprising:
generating a first output signal having a first operating point responsive to a reference voltage and an input voltage signal;
generating a second output signal having a second operating point responsive to the reference voltage and the input voltage signal;
applying a corresponding weight to the first and second output signals responsive to an output control signal; and
generating a third output signal based on the weighted first and second output signals.

20. The method of claim 18 including setting the first operating point relatively higher than the second operating point.

* * * * *